(12) United States Patent
Hierlemann et al.

(10) Patent No.: US 8,016,941 B2
(45) Date of Patent: Sep. 13, 2011

(54) METHOD AND APPARATUS FOR MANUFACTURING A SEMICONDUCTOR

(75) Inventors: Matthias Hierlemann, Fishkill, NY (US); Ja-Hum Ku, LaGrangeville, NY (US)

(73) Assignees: Infineon Technologies AG, Neubiberg (DE); Samsung Electronics Co., Ltd., Gyeonggi-do (KR)

( * ) Notice: Subject to any disclaimer, the term of this patent is extended or adjusted under 35 U.S.C. 154(b) by 276 days.

(21) Appl. No.: 11/671,158

(22) Filed: Feb. 5, 2007

(65) Prior Publication Data

US 2008/0188046 A1    Aug. 7, 2008

(51) Int. Cl.
- *C30B 11/00* (2006.01)
- *C30B 5/00* (2006.01)
- *H01L 21/337* (2006.01)
- *H01L 27/12* (2006.01)

(52) U.S. Cl. ............ 117/11; 117/4; 117/9; 117/10; 438/187; 438/198; 438/199; 438/275; 438/299; 257/357; 257/627

(58) Field of Classification Search ............ 117/4, 9–11; 257/347, 627, E21.133, E21.12; 438/299, 438/322, 199, 275, 455, 788, 791, 792, 187, 438/198

See application file for complete search history.

(56) References Cited

U.S. PATENT DOCUMENTS

| | | | |
|---|---|---|---|
| 5,391,903 A * | 2/1995 | Strater et al. | 257/351 |
| 7,531,392 B2 * | 5/2009 | Ellis-Monaghan et al. | 438/150 |
| 7,608,522 B2 * | 10/2009 | Lin et al. | 438/455 |
| 2005/0093104 A1 * | 5/2005 | Ieong et al. | 257/627 |
| 2005/0116290 A1 * | 6/2005 | de Souza et al. | 257/347 |
| 2005/0236687 A1 * | 10/2005 | Chan et al. | 257/482 |
| 2005/0255659 A1 | 11/2005 | Wu et al. | 438/299 |
| 2006/0024931 A1 * | 2/2006 | Chan et al. | 438/528 |
| 2006/0049460 A1 | 3/2006 | Chen et al. | 257/347 |
| 2006/0065954 A1 * | 3/2006 | Nowak | 257/627 |
| 2006/0094195 A1 | 5/2006 | Liu et al. | 438/301 |
| 2006/0099763 A1 | 5/2006 | Liu et al. | 438/299 |
| 2006/0105533 A1 | 5/2006 | Chong et al. | 438/322 |
| 2006/0113629 A1 | 6/2006 | Wei et al. | 257/521 |
| 2007/0215984 A1 * | 9/2007 | Shaheen et al. | 257/618 |

FOREIGN PATENT DOCUMENTS

| | | |
|---|---|---|
| JP | 2004260240 | 9/2004 |
| JP | 2004311367 | 11/2004 |
| WO | WO 2005/112104 A2 | 11/2005 |

* cited by examiner

*Primary Examiner* — Bob M Kunemund
*Assistant Examiner* — G. Nagesh Rao
(74) *Attorney, Agent, or Firm* — Saul Ewing LLP

(57) ABSTRACT

A method and apparatus for crystallizing a semiconductor that includes a first layer having a first crystal lattice orientation and a second layer having a second crystal lattice orientation, comprising amorphizing at least a portion of the second layer, applying a stress to the second layer and heating the second layer above a recrystallization temperature.

15 Claims, 2 Drawing Sheets

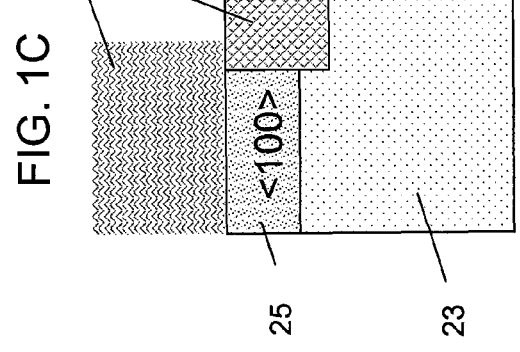
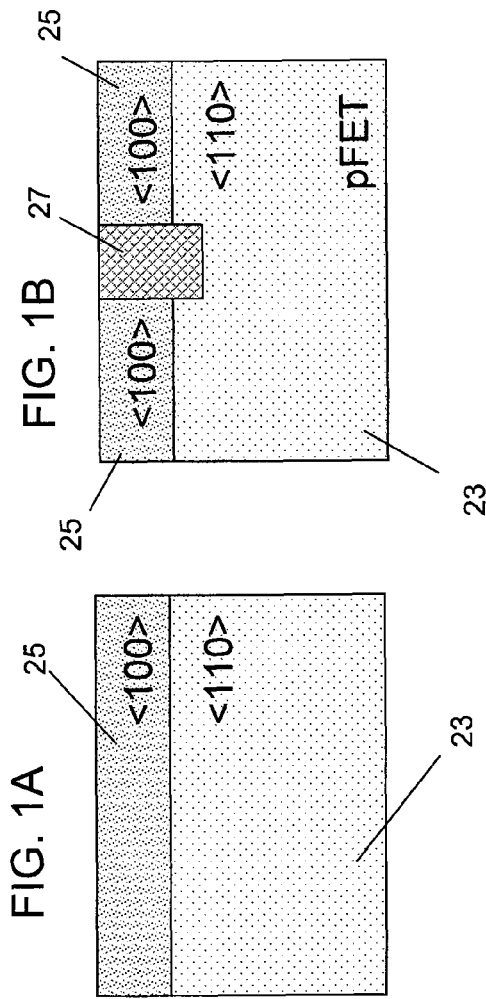
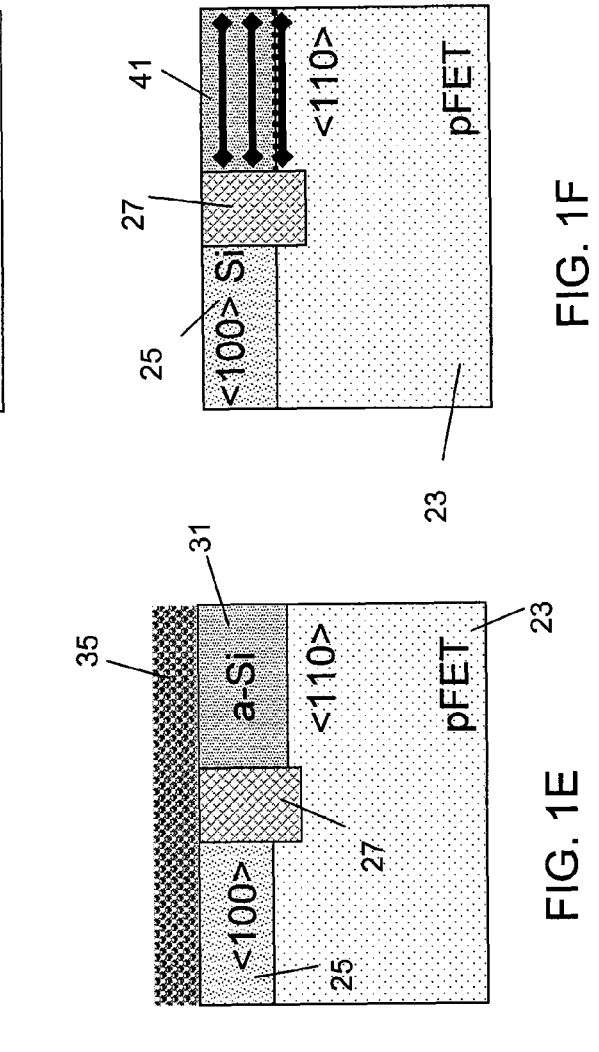
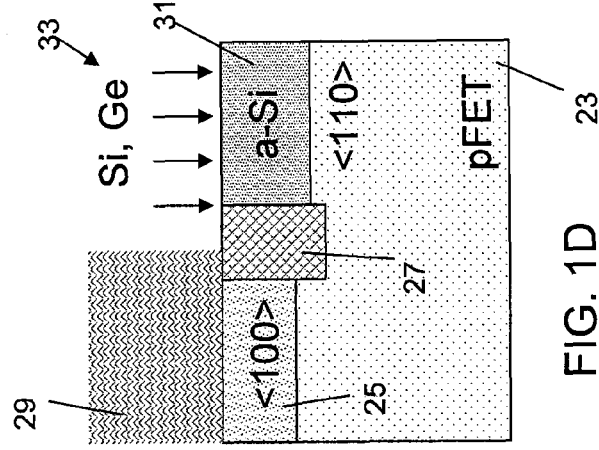

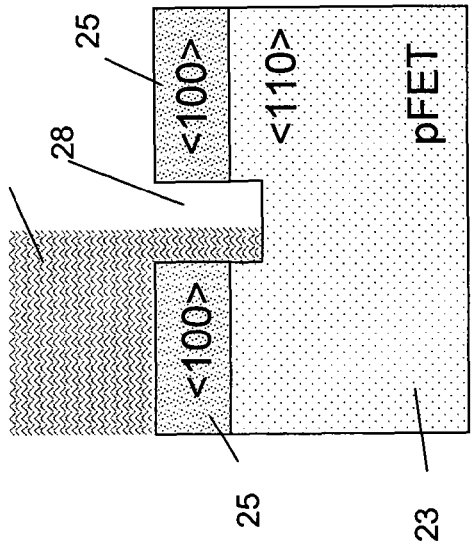
FIG. 2A
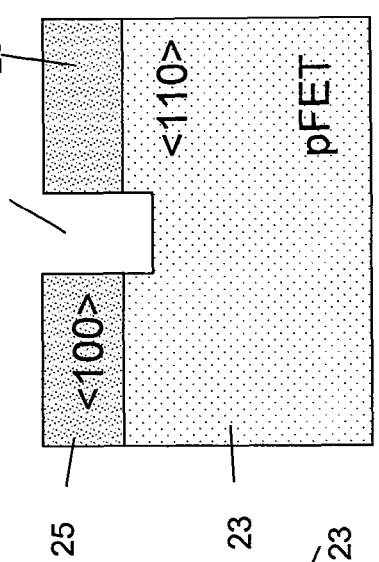
FIG. 2B
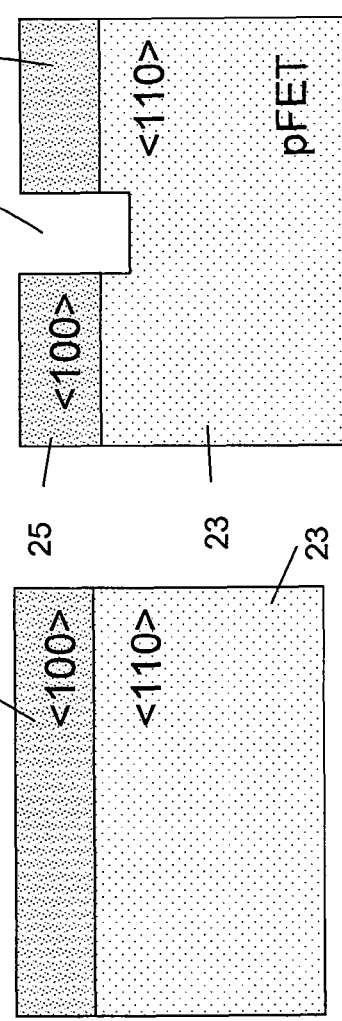
FIG. 2C
FIG. 2D
FIG. 2E
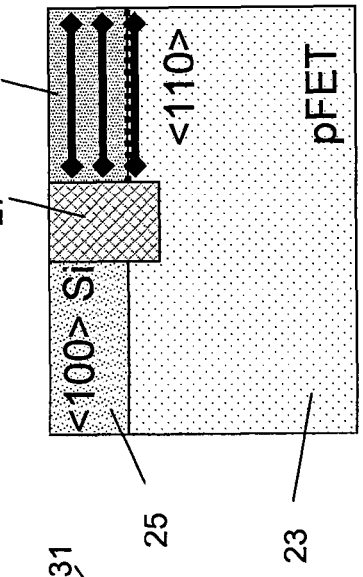
FIG. 2F

METHOD AND APPARATUS FOR MANUFACTURING A SEMICONDUCTOR

BACKGROUND OF THE INVENTION

The invention pertains to semiconductor fabrication. More particularly, the invention pertains to improving performance of semiconductor devices by stress engineering.

In the fabrication of semiconductor devices, there is a constant drive to make the devices smaller and more densely packed. However, there are limits to these reductions due to performance and fabrication issues. Accordingly, attention has been given to ways to increase the performance of semiconductor circuits.

One such solution involves selectively orienting the crystal lattice structure of the semiconductor substrate to improve device performance. Particularly, the orientation of the crystal lattice of the material results in different electron and/or hole mobility, and thus different performance of the semiconductor devices. For instance, substrates having a 1-0-0 crystal lattice orientation favor electron mobility and are thus preferred for nFET devices, whereas substrates having a 1-1-0 crystal lattice orientation provide good hole mobility and are thus preferred for pFET devices. Accordingly, techniques have been developed to create semiconductor substrates that have different regions with different crystal lattice orientations. The n-type devices are fabricated in the regions having 1-0-0 orientation while the p-type devices are fabricated in the regions having 1-1-0 orientation. These techniques are often referred to as hybrid orientation techniques. In one type of hybrid orientation process, two layers of crystallized and oriented semiconductor substrates are directly bonded to each other, one layer crystallized in the 1-1-0 orientation and the other layer crystallized in the 1-0-0 orientation and the lower, e.g., 1-1-0 -oriented, layer brought to the top surface of the substrate in selected regions.

There are several techniques known for accomplishing this task. In one technique, the top layer is etched completely through (i.e., removed) in selected regions so as to expose the underlying layer. The exposed lower layer material is epitaxially grown to bring it up to the same height as the top surface of the remaining 1-0-0 oriented material. Alternately, the upper layer material is amorphized in selected regions by depositing ions. Then, the wafer is annealed to recrystallize the upper layer in the selected regions, the material recrystallizing to the orientation of the 1-1-0 orientation of the material layer underneath it. Another solution involves applying mechanical stress to the crystal lattice structure of the semiconductor material so as to distort the crystal lattice of the material, which increases the electron and/or hole mobility in the material.

In one technique for adding mechanical stress to a semiconductor substrate after the devices have been created in the substrate, a stress liner, such as a nitride layer, is deposited on top of the substrate. The direction and amount of stress is controllable by the particular process parameters used to deposit the stress liner, such as the thickness of the stress liner (which primarily affects the amount of stress), the temperature and pressure of the vapor process, and the impurities (e.g., materials in addition to nitride) intentionally included in the layer. In another technique known as stress memory transfer, previously crystallized semiconductor material is amorphized and then an external mechanical stress is applied to the substrate, such as by depositing a nitride stress liner on top of the substrate. Next, the amorphized material is recrystallized, such as by annealing, while the substrate is subject to the external stress. Finally, the external mechanical stress is removed, such as by removing the nitride stress liner, and the stress, or at least much of it, remains baked into the substrate.

SUMMARY OF THE INVENTION

A method and apparatus for crystallizing a semiconductor that includes a first layer having a first crystal lattice orientation and a second layer having a second crystal lattice orientation, comprising amorphizing at least a portion of the second layer, applying a stress to the second layer and heating the second layer above a recrystallization temperature.

BRIEF DESCRIPTION OF THE DRAWINGS

FIGS. 1A-1F are schematic plan view diagrams illustrating the semiconductor during various junctures in a fabrication process in accordance with an embodiment of the present invention.

FIGS. 2A-2F are schematic plan view diagrams illustrating the semiconductor during various junctures in an alternative fabrication process in accordance with an embodiment of the present invention.

DETAILED DESCRIPTION OF THE INVENTION

The invention provides a technique for fabricating semiconductor devices having improved performance characteristics and increased carrier mobility. The technique introduces both hybrid orientation and stress memory transfer into the substrate while adding minimal additional fabrication steps.

FIGS. 1A-1F illustrate semiconductor fabrication steps involved in orienting and stressing a semiconductor in accordance with the principles of the present invention.

With reference to FIG. 1A, the starting semiconductor substrate in one exemplary embodiment comprises two direct-bonded layers 23, 25 of semiconductor material, e.g., silicon. The crystal lattice of the lower layer 23 is oriented in a first orientation, e.g., 1-1-0 optimized for hole mobility and, therefore, preferred for the formation of p type devices therein. The upper layer 25 has a different cut such that its crystal lattice structure is oriented in a different direction, e.g., 1-0-0 optimized for electron mobility and, therefore, preferred for the formation of n type devices therein. The two layers may be direct bonded to each other.

In one embodiment of the invention, shallow trench isolation (STI) regions 27 illustrated in FIG. 1B are etched with a suitable etch tool and filled to help isolate the transistor devices to be formed in the substrate from each other.

In accordance with embodiments of the invention, it is desired to reorient certain regions of the top layer 25 from one orientation, e.g., 1-0-0, to another orientation, e.g., 1-1-0, so that some regions of the substrate (the 1-1-0 regions) will be optimized for p-type transistors, while other regions (the 1-0-0 regions) will be optimized for n-type devices. Thus, as shown in FIG. 1C, photoresist 29 is deposited and patterned to cover the regions of the upper layer 25 that are to remain in the 1-0-0 orientation and to expose the regions of the upper layer 25 that are to be reoriented to the 1-1-0 orientation.

The exposed portions of the substrate are then amorphized, such as by implantation of Si, Ge, or C ions (FIG. 1D) in an ion implanter. The ions are implanted in the exposed portions of the surface of the substrate, but do not become substituted into the crystal lattice. Therefore, the implanted ions relax the crystal lattice structure of the substrate in the exposed regions. This leaves amorphous regions 31 in the top layer. The photoresist 29 is then removed.

Referring to FIG. 1E, an external stress is applied to the surface of the substrate. Any suitable technique for applying external stress to the substrate may be used, including formation of a stress liner or bending of the wafer. In the exemplary embodiment, a stress liner 35 is deposited over the entire surface of the substrate.

In one embodiment, the stress liner 35 may be primarily nitride with a certain composition and processed in a certain way in order to provide the desired direction (tensile or compressive) and amount of stress. However, other materials are possible for use as stress liners in semiconductor fabrication. Any material that does not contaminate, can be etched, and applies a stress to an underlying layer is suitable. The thickness, impurities, and temperature and pressure of deposition should be selected to provide a suitable direction and amount of stress. In one embodiment, stress liner 35 is deposited prior to the fabrication of any of the transistors in the semiconductor substrate. Hence, there are essentially no limitations on the thickness of the stress liner 35. The stress liner may be placed using any suitable technique or tool, including but not limited to CVD, PVD, SA CVD, and PE CVD using a suitable vapor deposition tool.

With the stress liner in place, the substrate is heated above the recrystallization temperature to anneal it in a suitable heating apparatus, such as an annealing oven. This annealing process will cause the amorphous region 31 to pick up the crystalline lattice structure of the underlying layer 23 (i.e., 1-1-0) as well as simultaneously bake in the stress from the overlying stress liner 35 in accordance with stress memory transfer principles. Accordingly, simultaneously, the amorphous region 31 is recrystallized in the 1-1-0 crystal lattice orientation and receives stress memory transfer. On the other hand, the 1-0-0 regions 25 remain essentially unaffected. Particularly, since regions 25 already are crystallized in the 1-0-0 orientation, they will neither be reoriented nor will they pick up the stress memory from the overlying stress liner 35.

The stress liner 35 is then removed using any suitable technique such as, but not limited to, wet or dry etching with a suitable etch tool. Such techniques may include wet etching or dry etching with a suitable chemical composition in a suitable etch tool. This leaves the device as shown in FIG. 1F, having regions 41 (formerly regions 31) that are oriented in the 1-1-0 orientation of the underlying substrate layer 23 and also having baked in mechanical stress that was taken up from the previously overlying stress liner 35. On the other hand, since the 1-0-0 oriented regions 25 already were crystallized, none or little of the stress from the stress liner is baked into those regions and those regions 25 return essentially fully to their pre-stress liner relaxed state after the stress liner 35 is removed.

The substrate is now ready to have n type devices formed in the 1-0-0 oriented regions 25 and p type devices formed in the 1-1-0 oriented regions 41.

If desired, the wafer can be further processed in any way to add stress to the 1-0-0 oriented regions 25, either before or after the devices are fabricated. In fact, even the 1-1-0 oriented regions 41 may be further processed in any way to add even further stress, if desired.

While the invention has been described above in connection with a dual layer hybrid oriented substrate, it should be understood that the substrate may comprise any number of additional layers and techniques in accordance with the present invention that can be performed in connection with separate layers (or pairs of layers) of a multilayer substrate. Furthermore, while the invention has been described above in connection with a dual layer starting substrate comprising two different cuts of oriented silicon, this is merely exemplary. The two layers having different orientations can be provided by other techniques also. For instance, semiconductor substrates comprising two layers of silicon separated by an insulating layer are widely used and techniques in accordance with the present invention can be applied in connection with such substrates also. As another example, the present invention can be useful in connection with single layer oriented substrates. For instance, it may be desirable to amorphize regions of the substrate and then recrystallize by annealing either without specifically orienting the lattice or re-orienting the lattice by techniques other than hybrid orientation. An external stress can be applied, such as by use of a stress liner, by bending the wafer, or by another technique for introducing stress, and then annealing to simultaneously bake in the stress and recrystallize.

FIGS. 2A-2F illustrate a process in accordance with an alternative embodiment of the present invention. In this embodiment, the trenches are etched (as in the embodiment of FIGS. 1A-1F), but instead of being immediately filled, they are left empty until after the stress liner 35 is first deposited and then removed.

Specifically, with reference to FIG. 2A, the process starts with two direct-bonded layers 23, 25 of semiconductor material. Shallow trench isolation (STI) regions 28 are then etched therein, as shown in FIG. 2B.

Next, as shown in FIG. 2C, photoresist 29 is deposited and patterned to cover the regions of the upper layer 25 that are to remain in the 1-0-0 orientation and to expose the regions of the upper layer 25 that are to be reoriented to the 1-1-0 orientation. As shown in FIG. 2D, the exposed portions of the substrate are then amorphized, leaving amorphous regions 31 in the top layer.

The photoresist 29 is then removed. Next, with reference to FIG. 2E, a stress liner 35 is deposited.

As can be seen in FIG. 2E, since the STI trench 28 is empty, the stress liner is deposited not only on the upper surface of the substrate but also inside of the empty trench 28.

With the stress liner 35 in place, the substrate is heated above the recrystallization temperature to anneal it. This annealing process will cause the amorphous region 31 to pick up the crystalline lattice structure of the underlying layer 23 (i.e., 1-1-0) as well as simultaneously bake in the stress from the overlying stress liner 35.

Since the stress liner 35 not only contacts and applies stress along the upper surface of the amorphous region 31, but also contacts and applies stress along the side walls 43 of the amorphous regions 31 in the trenches 28, the stress is applied along more area of the amorphous region 41, and particularly, to a much greater depth adjacent the walls 43.

The stress liner 35 is then removed, leaving the device as shown in FIG. 2F having regions 44 (formerly regions 31) that are oriented in the 1-1-0 orientation of the underlying substrate layer 23 and also having even greater baked in mechanical stress taken up from the stress liner 35 than in the embodiment described in connection with FIGS. 1A-1F.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. A method for crystallizing a semiconductor, comprising:
providing a semiconductor substrate comprising a first layer having a first crystal lattice orientation and a second layer having a second crystal lattice orientation different from said first crystal lattice orientation;
subsequently amorphizing a portion of said second layer;
subsequently applying an external stress to said second layer; and
subsequently heating said second layer above a recrystallization temperature of said second layer to simultaneously cause said portion of said second layer to recrystallize with the first crystal lattice orientation of the first layer and bake stress from the external stress into said portion of said second layer.

2. The method of claim 1, wherein applying said external stress comprises applying a stress liner over said second layer.

3. The method of claim 1, wherein applying said external stress comprises bending said second layer.

4. The method of claim 1, further comprising forming trenches in said substrate.

5. The method of claim 1, further comprising removing said external stress after said heating.

6. The method of claim 5, further comprising filling isolation trenches formed in said substrate after removing said external stress.

7. The method of claim 1, wherein amorphizing said portion of said second layer comprises implanting ions in at least said portion of said second layer at a temperature above said recrystallization temperature of said second layer.

8. The method of claim 4 wherein applying said external stress comprises applying stress in said trenches.

9. A method of manufacturing semiconductor devices, comprising:
providing a semiconductor substrate comprising a first layer with a first crystal orientation and a second layer with a second crystal orientation different from said first orientation;
subsequently amorphizing a first region of said second layer;
subsequently applying an external stress to said second layer;
subsequently heating said second layer above a recrystallization temperature,
whereby said first region of said second layer is recrystallized with the first crystal lattice orientation of the first layer and simultaneously stress from the external stress is baked into said first region of said second layer; and
subsequently forming a first device in said first region of said second layer and a second device in a second region of said second layer.

10. The method of claim 9, further comprising forming at least one isolation trench within said second layer.

11. The method of claim 9, wherein said first device is a p-channel transistor and said second device is an n-channel transistor.

12. The method of claim 10, wherein applying said external stress comprises applying said stress in said at least one isolation trench.

13. A method of fabricating semiconductor circuits, comprising:
providing a semiconductor substrate;
subsequently amorphizing a portion of said substrate;
subsequently applying stress to said substrate;
subsequently heating said substrate above a recrystallization temperature of said substrate to simultaneously cause said portion of said second layer to recrystallize and cause the external stress to become baked into said portion of said second layer; and
subsequently fabricating electronic devices in said substrate.

14. The method of claim 13, wherein said substrate comprises a first layer having a first crystal lattice orientation and a second layer having a second crystal lattice orientation different from said first crystal lattice orientation, and wherein amorphizing said portion of said substrate and fabricating said electronic devices in said substrate are performed in said second layer.

15. The method of claim 13, further comprising removing said stress after heating said substrate above said recrystallization temperature.

* * * * *